United States Patent [19]
Tiller et al.

[11] Patent Number: 5,896,062
[45] Date of Patent: Apr. 20, 1999

[54] AMPLIFIER WITH SWITCHED DC BIAS VOLTAGE FEEDBACK

[75] Inventors: Samuel A. Tiller; Stephen G. Roy, both of Ottawa, Canada

[73] Assignee: Northern Telecom Limited, Montreal, Canada

[21] Appl. No.: 08/822,460

[22] Filed: Mar. 21, 1997

[51] Int. Cl.[6] .................................. H03F 3/45; H03F 3/68
[52] U.S. Cl. ........................ 330/252; 330/259; 330/295; 330/300; 330/296
[58] Field of Search ............................ 330/252, 253, 330/259, 261, 295, 296, 300

[56] References Cited

U.S. PATENT DOCUMENTS

| | | | |
|---|---|---|---|
| 5,451,907 | 9/1995 | Keane et al. | 330/296 |
| 5,578,963 | 11/1996 | Andersen | 330/252 |

OTHER PUBLICATIONS

"Low-Current RFIC Downconverter", pp. 1–14, (1994).
Mohindra, "Isolator For DECT Open Loop Modulation", *RF Synthesizers*, pp. 30–42, (1996).

*Primary Examiner*—Steven Mottola

[57] ABSTRACT

In an amplifier circuit, bias feedback to an amplifying transistor is provided by interconnecting the DC bias voltage applied to the transistor output and the transistor input with a feedback circuit consisting of a switching transistor and bias resistors. Bias current and stable operation is provided by this design. In a particular embodiment two common emitter amplifying transistors are connected to a common output and each has a separate bias feedback circuit including a respective switching transistor. A single DC control input connected to the inputs of both switching transistors can be used to switch between the two amplifying transistors depending on the value of the control voltage thereby amplifying either an input signal of the first amplifying transistor or an input signal of the second amplifying transistor.

14 Claims, 4 Drawing Sheets

AMPLIFIER WITH SWITCHED DC BIAS VOLTAGE FEEDBACK

BACKGROUND OF THE INVENTION

This invention relates to amplifier circuitry particularly but not exclusively intended for use in selective connection to either of two antennas feeding a radio receiver.

Space diversity can reduce the effect of multipath fading in radio receivers. By using two antennas placed an adequate distance apart, a receiver can be made such that it selects the one with the strongest signal, thereby giving an overall improvement in reception. FIG. 1(a) shows the basic concept in which a switch selectively connects a low noise amplifier (LNA) forming part of the receiver to one or other of the two antennas. This arrangement, however, is generally not practical since the switch will have some insertion loss which will degrade the receiver's sensitivity to weak signals. FIG. 1(b) shows the common topology with the switch moved farther down the receiver chain for greater sensitivity. In this case two LNAs are connected between the respective antennas and the switch such that, in effect, the switch selects the output of one or other of the LNA's. A problem with this arrangement is that, as both LNA's are running continuously, it requires twice the current and is more complicated because it requires additional output switch circuitry.

The problem of high current requirement is overcome in a device marketed under the part number TQ9203 by Triquint Semiconductor, Inc. as described in the Triquint data sheet entitled "Low-Current RFIC Downconverter" and dated Apr. 21, 1994. This device is a multifunction RF downconverter in which an LNA section comprises two parallel connected common source FET (field effect transistor) amplifiers each having an input connected to a respective antenna and a common output. A "Select" or "Control" terminal controls a bias circuit connected directly to the gates of the two transistors such that, when a control signal indicative of a stronger reception signal on one antenna is applied, the transistor connected to the one antenna is switched on and the other transistor is switched off and, when the control signal has a value indicative of a stronger signal on the other antenna, the transistors are switched to the opposite state. In this way the stronger antenna signal is conducted to the common output.

One problem with the Triquint device is that it has a relatively high gain variation with temperature. In addition it is designed only for operation in the range 800 to 1000 MHz and would not work at low frequency because of AC coupled inputs.

SUMMARY OF THE INVENTION

It is an object of the invention to provide a device which overcomes or reduces one or more of the problems associated with the prior art devices.

According to one aspect the present invention, there is provided an amplifier circuit comprising: a first amplifying transistor having an input electrode, an output electrode and a common electrode; a first signal input connected to the input electrode of the first amplifying transistor; a second amplifying transistor having an input electrode, an output electrode and a common electrode; a second signal input connected to the input electrode of the second amplifying transistor; a common signal output connected to the output electrodes of the first and second transistors; a DC biasing input connected to the output electrodes of the first and second transistors; a first bias feedback circuit connected between the DC biasing input and the input electrode of the first amplifying transistor; a second bias feedback connected between the DC biasing input and the input electrode of the second amplifying transistor; the first bias feedback circuit including a first switching transistor and the second bias feedback circuit including a second switching transistor complementary with respect to the first switching transistor; and a DC control input connected to the first and second switching transistors, whereby below a first predetermined DC threshold the first switching transistor is on thereby biasing the first amplifying transistor on and the second switching transistor is off and above a second predetermined threshold the second switching transistor is on thereby biasing the second amplifying transistor on and the first switching transistor is off.

According to another aspect of the present invention, there is provided an amplifier circuit comprising: a first amplifying bipolar transistor having an input electrode, an output electrode and a common electrode; a first signal input connected to the input electrode of the first amplifying transistor; a second amplifying bipolar transistor having an input electrode, an output electrode and a common electrode; a second signal input connected to the input electrode of the second amplifying transistor; a common signal output connected to the output electrodes of the first and second transistors; a DC biasing input connected to the output electrodes of the first and second transistors; a first bias feedback circuit connected between the DC biasing input and the input electrode of the first amplifying transistor; a second bias feedback connected between the DC biasing input and the input electrode of the second amplifying transistor; the first bias feedback circuit including a first switching transistor and the second bias feedback circuit including a second switching transistor complementary with respect to the first switching transistor; and a DC control input connected to the first and second switching transistors, whereby below a first predetermined DC threshold the first switching transistor is on thereby biasing the first amplifying transistor on and the second switching transistor is off and above a second predetermined threshold the second switching transistor is on thereby biasing the second amplifying transistor on and the first switching transistor is off.

According to yet another aspect of the present invention, there is provided an amplifier circuit comprising: a first amplifying FET having an input electrode, an output electrode and a common electrode; a first signal input connected to the input electrode of the first amplifying FET; a second amplifying FET having a input electrode, an output electrode and a common electrode; a second signal input connected to the input electrode of the second amplifying FET; a common signal output connected to the output electrodes of the first and second FETs; a DC biasing input connected to the output electrodes of the first and second FETs; a first bias feedback circuit connected between the DC biasing input and the input electrode of the first FET; a second bias feedback circuit connected between the DC biasing input and the input electrode of the second FET; the first bias feedback circuit including a first switching transistor and the second bias feedback circuit including a second switching transistor; a first DC control input connected to the first switching transistor; and a second DC control input connected to the second switching transistor; whereby a voltage on one side of a predetermined threshold applied to either of the DC control input switches the appropriate switching transistor on thereby biasing the associated FET on and a voltage on the other side of the predetermined threshold switches the appropriate switching transistor off thereby biasing the associated FET off.

A principal advantage of the new design is, since the switched amplifiers share common bias sensing and output circuits, few components are required, and hence it can be made to fit into a small space. Another advantage is that the design is relatively inexpensive particularly when embodied in a discrete rather than integrated design since the components are inexpensive and readily available from multiple sources.

A further advantage is, since the switching transistors respectively complete DC bias voltage feedback loops, the switched amplifiers maintain the advantages of low variation of parameters such as DC current, gain, noise generation and distortion that is common in amplifiers that do not have a switch.

Furthermore, with minor variations the circuitry can be modified for operation in a different frequency band.

BRIEF DESCRIPTION OF THE DRAWINGS

Preferred embodiments of this invention will now be described with reference to the attached drawings in which.

DETAILED DESCRIPTION OF THE PREFERRED EMBODIMENTS

Figure 2:
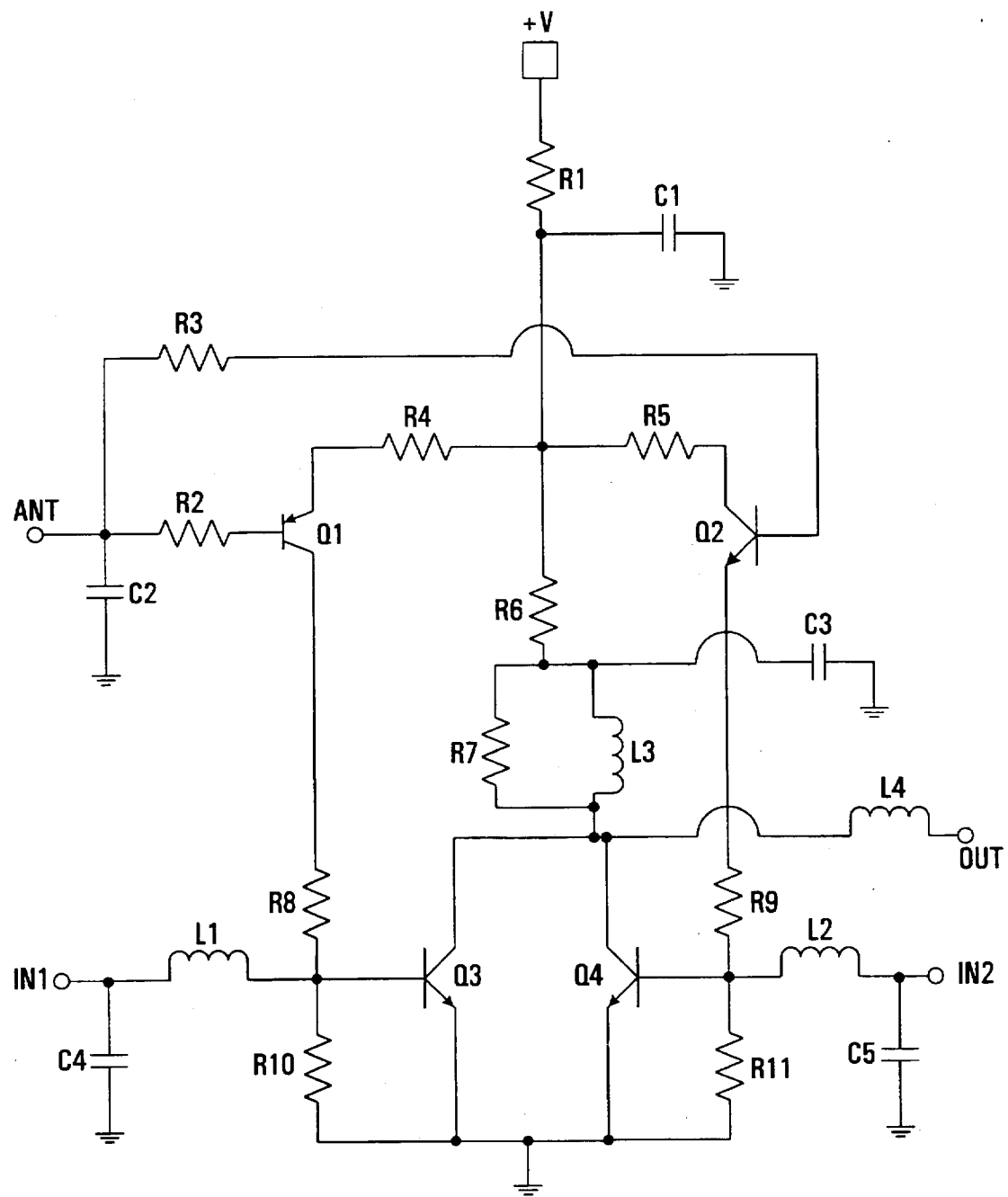
FIG. 2 is a schematic diagram illustrating a dual LNA according to one embodiment of the present invention.

Referring to FIG. 2, the circuit has two signal inputs IN1 and IN2 and a common signal output node, OUT. Current is supplied from a voltage source +V and selection between the two inputs IN1 and IN2 is done by applying specific DC voltages to a control input, ANT.

More specifically, input IN1 is connected through an inductor L1 to the base of an NPN transistor Q3 the emitter of which is connected to ground and input IN2 is connected through an inductor L2 to the base of an NPN transistor Q4, the emitter of which is connected to ground. Both collectors of transistors Q3 and Q4 are connected through an inductor L4 to the output node OUT.

The control input ANT is connected through a resistor R2 to the base of a PNP transistor Q1 and input ANT is also connected through a resistor R3 to the base of a complementary, i.e. NPN, transistor Q2. The emitter of transistor Q1 is connected through a resistor R4 and a resistor R5 to the collector of transistor Q2. The collector of transistor Q1 is connected through a resistor R8 to the base of transistor Q3 and a resistor R10 is connected across the base and emitter of transistor Q3. The emitter of transistor Q2 is connected through a resistor R9 to the base of transistor Q4 and a resistor R11 is connected across the base and emitter of transistor Q4.

Voltage source +V is connected through a resistor R1 to the junction of resistors R4 and R5 which, as indicated above, are connected to the emitter and collector respectively of transistor Q1 and Q2. This junction is also connected to a resistor R6 which is connected through a circuit, comprising a resistor R7 connected in parallel with an inductor L3, to the collectors of transistors Q3 and Q4.

The remaining components of the circuit of FIG. 2 are capacitors C1, C2, C3, C4 and C5. Capacitor C1 is connected between the junction of resistors R4 and R5 and ground, capacitor C2 is connected between input ANT and ground and capacitor C3 is connected between ground and the junction of resistor R6 and the parallel circuit of resistor R7 and inductor L3. Capacitors C4 and C5 are respectively connected between input IN1 and ground and between input IN2 and ground.

Q3 and Q4 are amplifier transistors which are turned on or off by switching transistors Q1 and Q2. Resistor R1 is the current sensing resistor required by the DC bias voltage feedback. Resistors R2 and R3 set the base current in the switching transistors Q1 and Q2. Resistors R4, R8, R10 and R5, R9 and R11 pass base bias current to transistors Q3 and Q4 respectively. In addition they form voltage dividing ladders that set the four transistors to the desired bias region (i.e. on, off or saturated) for a given ANT control voltage setting. Resistor R6 and capacitor C3 are for high frequency decoupling and stabilization. R6 should be small to give the largest collector voltage feedback possible. They may not be required in low frequency applications. Capacitors C1 and C2 are also for high frequency decoupling.

Resistor R7 and inductor L3 are part of the output matching network and are therefore not essential to this invention; however, if inductor L3 is omitted and only R7 is used the DC bias stabilization will be compromised. Inductors L1, L2, L4 and capacitors C4 and C5 are all for impedance matching. Capacitors C4 and C5 are not essential.

To explain the operation of the circuit, an equilibrium condition is assumed, the remaining biasing values are chosen based on these assumptions, and the assumptions are then verified empirically or by simulation. Assume transistor Q3 is biased in the active region and transistor Q1 is biased in the active region and transistor Q1 is forward saturated. Resistor R3 is chosen such that the current through it is about 5 times the base current of transistor Q3. Transistors Q4 and Q2 are off. The choice of resistor R4 and consequently resistors R8 and R10 sets the threshold ANT voltage for turning off transistor Q1 and transistor Q3. The value of resistor R2 is such that its current is much less than that of resistor R8 since any current in resistor R2 diminishes the effectiveness of the DC bias voltage feedback.

With the correct resistor values and ANT voltage chosen, the equilibrium condition of transistors Q1 and Q3 being on can be satisfied. Any increase in the ANT voltage will decrease the current in transistor Q1 and eventually, when a first threshold is reached, transistor Q1 will switch off consequently turning transistor Q3 off.

In a similar manner the biasing resistors R3, R5, R9 and R11 are chosen. The only difference is in choosing a second threshold ANT voltage which turns transistor Q2 forward saturated and transistor Q4 on. Thus, as the voltage ANT increases from zero, transistor Q3 transitions from the on state until the first threshold where it is effectively switched off. Further increases in the ANT voltage pass through a region where both transistors Q3 and Q4 are off until the second threshold is reached. At this point transistor Q4 starts to turn on as ANT is increased to the point where the voltage across the collector-base junction of transistor Q2 becomes zero.

The use of the two different thresholds prevent noise from turning the transistors on and off but ideally the first and second thresholds could be the same voltage value.

The detailed schematic of FIG. 2 shows a circuit that was designed for low noise amplification in the 800 MHz cellular band and hence includes components for reactive matching and prevention of high frequency oscillation. Some modification to the circuit can be made that would broaden the application of this invention. Resistor R6 is for high frequency stability and can be omitted if it is not necessary. Capacitors C4, C5 and inductor L1, L2 and L4 are only for impedance matching and may not be needed. Inductor L3 is part of the output matching network but omitting it would degrade the DC bias stability. Capacitors C1 and C3 used for high frequency decoupling may also be omitted. Omitting the above components results in the circuit shown in FIG. 3 which may be more suited to low frequency applications.

Figure 3:
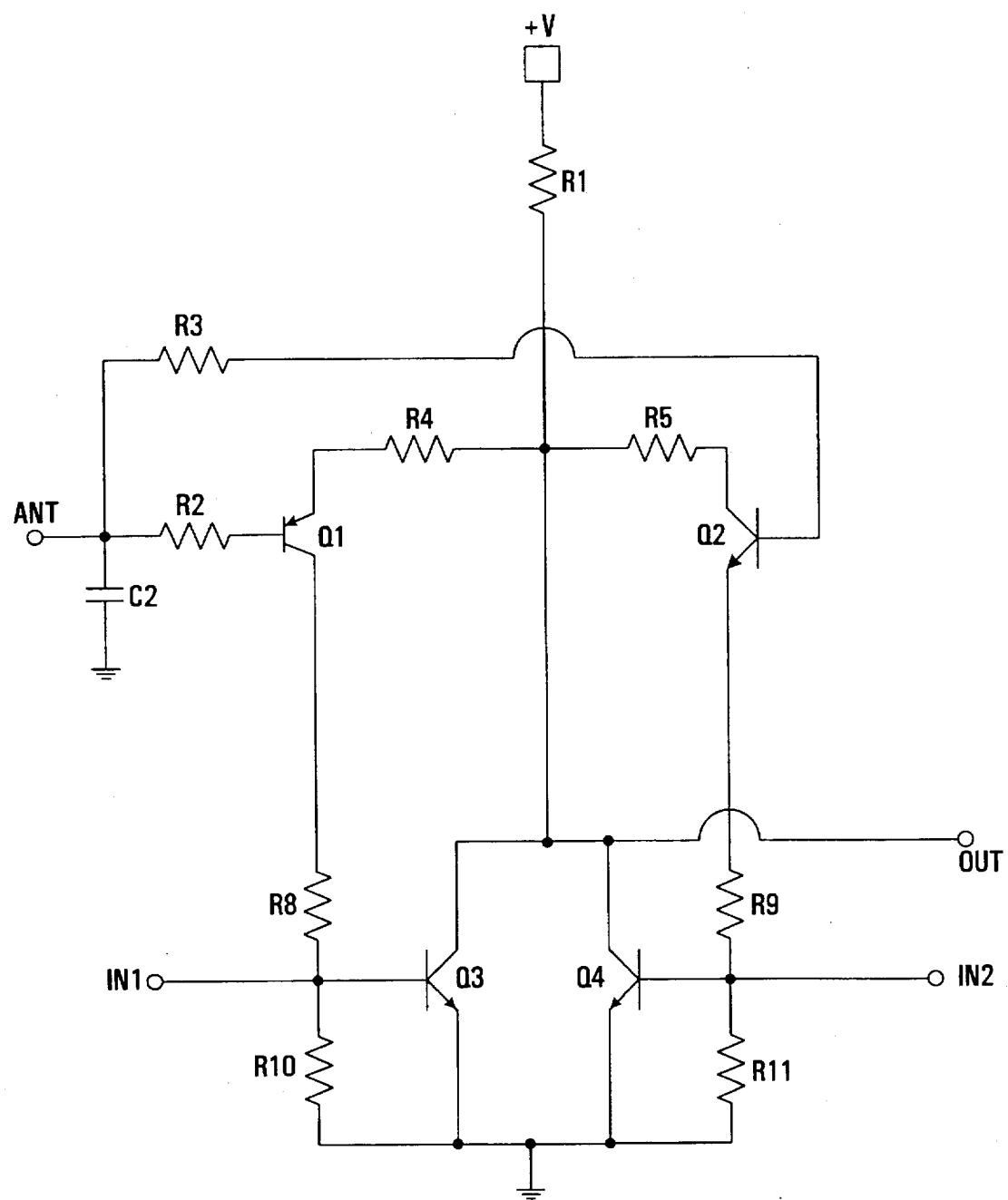
FIG. 3 is a schematic diagram illustrating a dual LNA according to another embodiment of the present invention.

It is noted that the circuitry common to FIGS. 2 and 3 comprises two parallel connected common emitter transistor amplifiers Q3 and Q4 which have input IN1 connected to the base of transistor Q3, input IN2 connected to the base of transistor Q4 and a common output node connected to the collectors of transistors Q3 and Q4 and two complementary switching transistors Q1 and Q2 that supply both bias current and stabilization to the transistors Q3 and Q4. The DC bias feedback circuitry that provides the bias and stability comprises resistors R4, R8, R10 and switching transistor Q1 for amplifier transistor Q3 and resistors R5, R9, R11 and switching transistor Q2 for amplifier transistor Q4. If the DC current through transistor Q3, for example, increases the collector voltage decreases and this decrease is fed back to the base of transistor Q3 thereby decreasing the device current and leading to stability.

In order to reduce the amount of current flowing from the base of switching transistor Q2 to the emitter of transistor Q2 (which has the effect of disturbing the DC feedback) base resistor R3 is made large. For the same reason, base resistor R2 is made large.

In order to counter the effect of switch parasitics which could give rise to increased noise at the bases of transistors Q3 and Q4, lost gain at their collectors and matching problems the feedback resistors are made as large as possible.

The amplifying transistors of FIGS. 2 and 3 are bipolar transistors but they could be replaced with FETs. The biasing circuitry would differ from that shown in FIGS. 2 and 3 and might be difficult to achieve in a practical embodiment.

Figure 4:
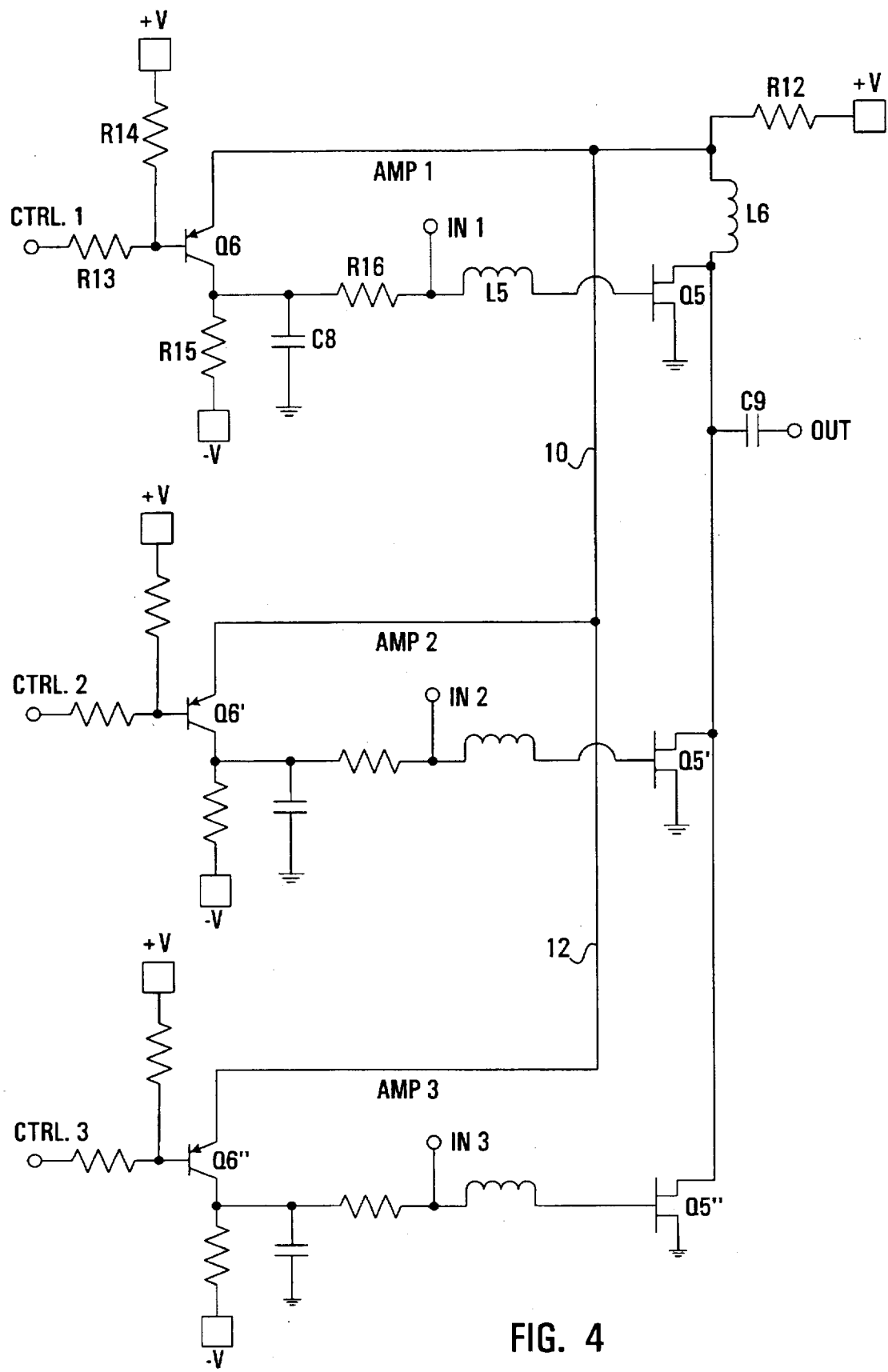
FIG. 4 is a schematic diagram illustrating a triple LNA according to a further embodiment of the invention.

FIG. 4, illustrates a practical embodiment of the invention using FETs as the amplifying transistors. In this case, a triple rather than a dual LNA is illustrated such that there are three signal inputs IN1, IN2 and IN3. As with the embodiments of FIGS. 2 and 3 there is a single output node, OUT.

It is not possible to select the signal input to be amplified using only a single control or select input, ANT. Rather, three separate control inputs, CTRL1, CTRL2, and CTRL3 are used, each controlling a respective amplifier circuit, AMP1, AMP2 and AMP3.

By way of example, AMP1 includes a depletion mode FET Q5 operating as an amplifier transistor and a bipolar PNP transistor Q6 operating as a switching transistor. The gate of the FET Q5 is connected through an inductor L5 to signal in IN1, the source of FET Q5 is connected to ground and the drain is connected through an inductor L6 and resistor R12 to a voltage source V+.

The control input CTRL 1 is connected to the base of transistor Q6 through a resistor R13 and a voltage source V+ is connected to the base through a resistor R14. The emitter of transistor Q6 is connected to the junction of resistor R12 and inductor L6. The collector of transistor Q6 is connected to a voltage source V− through a resistor R15 and the collector is also connected to signal input IN1 through a resistor R16. A capacitor C8 is interconnected between the collector of transistor Q6 and ground.

Amplifier circuits AMP2 and AMP3 are identical to AMP1 except that resistor R12 and inductor L6 do not have counterparts in circuits AMP2 and AMP3. A conductor 10 interconnects the emitter of transistor Q6 and the emitter of transistor Q6' and a conductor 12 interconnects the emitter of transistor Q6' and the emitter of transistor Q6". In this way a bias feedback circuit through each of transistors Q6, Q6' and Q6" includes the current sensing resistor R12. It is noted that the drains of the three FETs of AMP1, 2 and 3 are all connected to the common signal output, OUT, through a capacitor C9.

In operation, if the control signals CTRL1, 2 and 3 are all at the positive supply voltage V+, transistors Q6, Q6' and Q6" are all off and the gate voltages of all the amplifying FETs Q5, Q5' and Q5" are highly negative so that no current flows in any of the FETs.

Figure 1A:
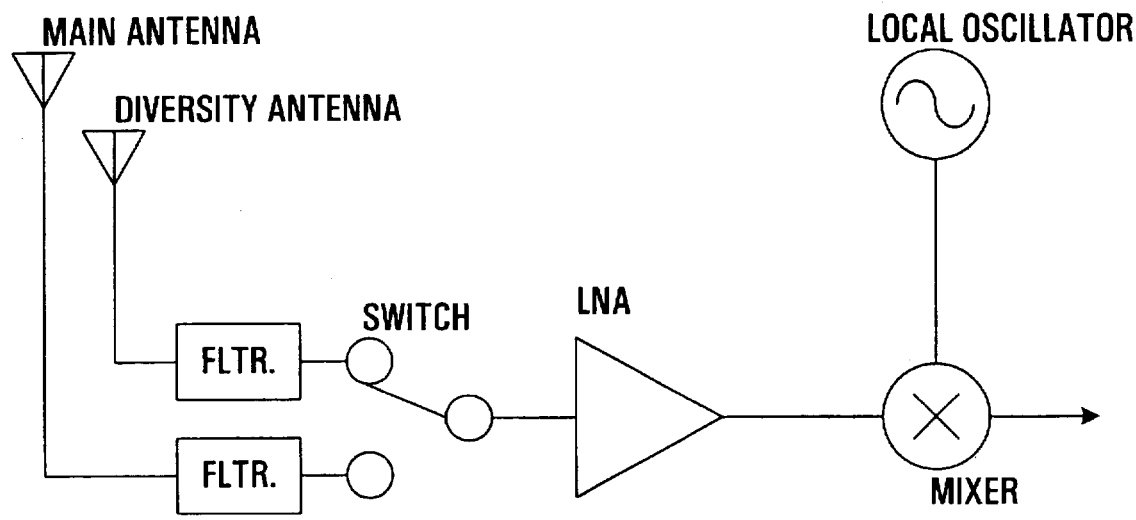
FIG. 1(a) is a block diagram illustrating an antenna diversity receiver front end according to a first prior art embodiment.
Figure 1B:
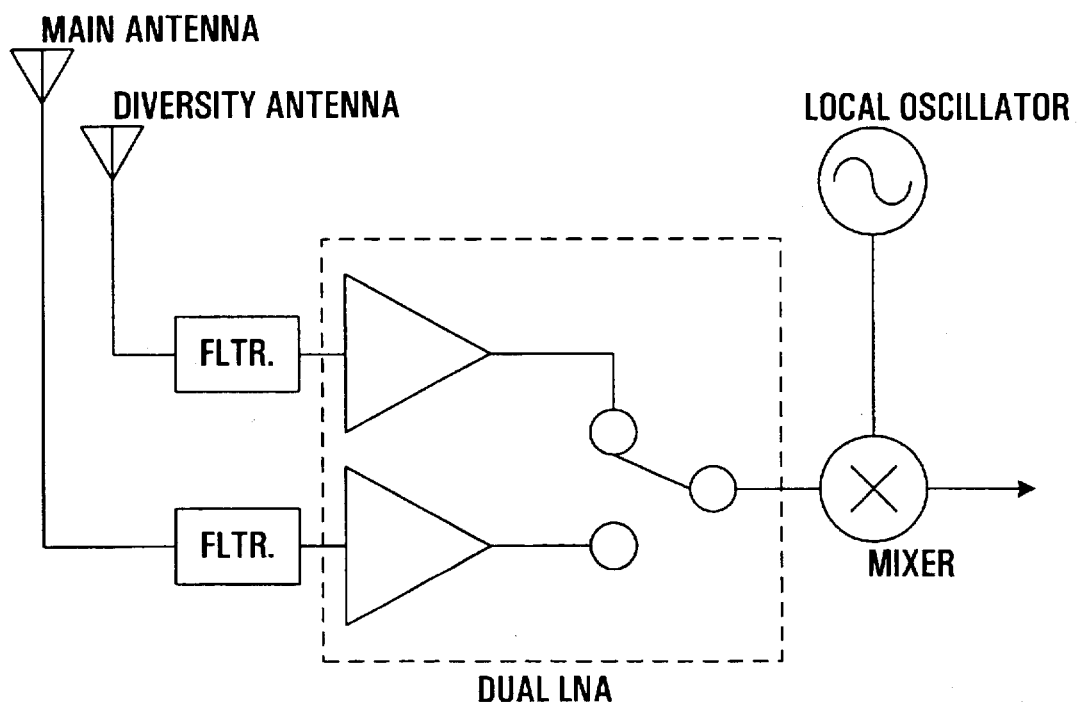
FIG. 1(b) is a block diagram illustrating an antenna diversity receiver front end according to a second prior art embodiment.

If any one of the control signals goes to a voltage below the positive supply voltage V+ such that the voltage at the base of the corresponding switching transistor Q6, Q6' or Q6" is low enough to turn on, the DC feedback is established through current sensing resistor R12, the switching transistor and bias resistors R15 and R16 and current flows in the corresponding FET Q5, Q5' or Q5". It is noted that, in contrast to the switching transistors Q1 and Q2 in the embodiments of FIGS. 1 and 2, the switching transistors Q6, Q6' and Q6" are not driven into forward saturation when they are on.

In the circuit of FIG. 4 the control input CTRL 1 is shown connected through a resistor R13 to the base of transistor Q6 and a voltage source V+ is also shown connected through a resistor R14 to the base of transistor Q6. In a modification of this circuit, the control input CTRL1 could be connected directly to the base of transistor Q6 and the connection of a voltage source V+ to the base could be eliminated. The parameters of the control voltage which causes switching would then change.

It can be seen that the circuitry of FIG. 4, like the circuitry of FIGS. 2 and 3, involves the use of a bias feedback circuit connected between the DC biasing input (V+) and the input electrode (gate) of FET Q5. The bias feedback circuit comprises the current sensing resistor R12 connected in series with the switching transistor Q6 which in turn is connected in series with bias resistor R16. Resistor R15 also forms part of the bias feedback circuit.

Numerous modifications lie within the scope of this invention. For example, although bipolar transistors have been described for the switching transistors in the specific embodiments it should be understood that other transistors, for example BJT's, FETs (MOS, MES, HEMT, J) could be used for switching.

We claim:

1. An amplifier circuit comprising:

a first amplifying transistor having an input electrode, an output electrode and a common electrode;

a first signal input connected to the input electrode of the first amplifying transistor;

a second amplifying transistor having an input electrode, an output electrode and a common electrode;

a second signal input connected to the input electrode of the second amplifying transistor;

a common signal output connected to the output electrodes of the first and second transistors;

a DC biasing input connected to the output electrodes of the first and second transistors;

a first bias feedback circuit connected between the DC biasing input and the input electrode of the first amplifying transistor;

a second bias feedback connected between the DC biasing input and the input electrode of the second amplifying transistor;

the first bias feedback circuit including a first switching transistor and the second bias feedback circuit including a second switching transistor complementary with respect to the first switching transistor; and a DC control input connected to the first and second switching transistors, whereby below a first predetermined DC threshold the first switching transistor is on thereby biasing the first amplifying transistor on and the second switching transistor is off and above a second predetermined threshold the second switching transistor is on thereby biasing the second amplifying transistor on and the first switching transistor is off.

2. An amplifier circuit comprising:

a first amplifying bipolar transistor having an input electrode, an output electrode and a common electrode;

a first signal input connected to the input electrode of the first amplifying transistor;

a second amplifying bipolar transistor having an input electrode, an output electrode and a common electrode;

a second signal input connected to the input electrode of the second amplifying transistor;

a common signal output connected to the output electrodes of the first and second transistors;

a DC biasing input connected to the output electrodes of the first and second transistors;

a first bias feedback circuit connected between the DC biasing input and the input electrode of the first amplifying transistor;

a second bias feedback connected between the DC biasing input and the input electrode of the second amplifying transistor;

the first bias feedback circuit including a first switching transistor and the second bias feedback circuit including a second switching transistor complementary with respect to the first switching transistor; and a DC control input connected to the first and second switching transistors, whereby below a first predetermined DC threshold the first switching transistor is on thereby biasing the first amplifying transistor on and the second switching transistor is off and above a second predetermined threshold the second switching transistor is on thereby biasing the second amplifying transistor on and the first switching transistor is off.

3. An amplifier circuit according to claim 2, wherein the first and second amplifying transistors are common emitter amplifiers.

4. An amplifier circuit according to claim 3, wherein the first bias feedback circuit also includes a current sensing resistor connected between the DC biasing input and the collectors of the first and second amplifying transistors and at least one further resistor, the first switching transistor being connected in series between the current sensing resistor and the at least one further resistor, and wherein the second bias feedback circuit also includes the current sensing resistor and at least one more resistor, the second switching transistor being connected in series between the current sensing resistor and the at least one more resistor.

5. An amplifier circuit according to claim 4, wherein a resistor is connected between the base and emitter of the first amplifying transistor and a resistor is connected between the base and emitter of the second amplifying transistor.

6. An amplifier circuit according to claim 2, wherein the first and second thresholds are coincident.

7. An amplifier circuit according to claim 2, wherein the first and second switching transistors are bipolar transistors and wherein below the first threshold the first switching transistor is forward saturated and above the second threshold the second switching transistor is forward saturated.

8. An amplifier circuit according to claim 3, wherein the first and second switching transistors are bipolar transistors and wherein below the first threshold the first switching transistor is forward saturated and above the second threshold the second switching transistor is forward saturated.

9. An amplifier circuit according to claim 4, wherein the first and second switching transistors are bipolar transistors and wherein below the first threshold the first switching transistor is forward saturated and above the second threshold the second switching transistor is forward saturated.

10. An amplifier circuit according to claim 5, wherein the first and second switching transistors are bipolar transistors and wherein below the first threshold the first switching transistor is forward saturated and above the second threshold the second switching transistor is forward saturated.

11. An amplifier circuit comprising:

a first amplifying FET having an input electrode, an output electrode and a common electrode;

a first signal input connected to the input electrode of the first amplifying FET;

a second amplifying FET having a input electrode, an output electrode and a common electrode;

a second signal input connected to the input electrode of the second amplifying FET;

a common signal output connected to the output electrodes of the first and second FETs;

a DC biasing input connected to the output electrodes of the first and second FETs;

a first bias feedback circuit connected between the DC biasing input and the input electrode of the first FET;

a second bias feedback circuit connected between the DC biasing input and the input electrode of the second FET;

the first bias feedback circuit including a first switching transistor and the second bias feedback circuit including a second switching transistor;

a first DC control input connected to the first switching transistor; and a second DC control input connected to the second switching transistor;

whereby a voltage on one side of a predetermined threshold applied to either of the DC control input switches the appropriate switching transistor on thereby biasing the associated FET on and a voltage on the other side of the predetermined threshold switches the appropriate switching transistor off thereby biasing the associated FET off.

12. An amplifier circuit according to claim 11, wherein the first and second switching transistors are bipolar transistors and the FETs are connected as common source FETs.

13. An amplifier circuit according to claim 11 further comprising:

a third amplifying FET having an input electrode, an output electrode and a common electrode;

a third signal input connected to the input electrode of the third FET;

the common signal output and the DC biasing input also being connected to the output electrode of the third FET;

a third bias feedback circuit connected between the DC biasing input and the input electrode of the third FET;

the third bias feedback circuit including a third switching transistor; and a third DC control input connected to the third switching transistor;

whereby a voltage on one side of the predetermined threshold applied to the third DC control input switches the third switching transistor on thereby biasing the third FET on and a voltage on the other side of the predetermined threshold applied to the third DC control input switches the third transistor off thereby biasing the third FET on.

14. An amplifier circuit according to claim 13, wherein all of the switching transistors are bipolar transistors and the FETs are connected as common source FETs.

* * * * *